United States Patent
Chang et al.

(10) Patent No.: US 8,030,904 B2
(45) Date of Patent: Oct. 4, 2011

(54) OSCILLATOR CIRCUIT

(75) Inventors: Tsung-Hau Chang, Hsinchu (TW);
Chin-Hsun Hsu, Taipei County (TW)

(73) Assignee: Novatek Microelectronics Corp.,
Hsinchu (TW)

(*) Notice: Subject to any disclaimer, the term of this patent is extended or adjusted under 35 U.S.C. 154(b) by 315 days.

(21) Appl. No.: 12/401,623

(22) Filed: Mar. 11, 2009

(65) Prior Publication Data

US 2010/0156358 A1    Jun. 24, 2010

(30) Foreign Application Priority Data

Dec. 22, 2008 (TW) .............................. 97150121 A

(51) Int. Cl.
*H02J 7/00* (2006.01)
*H03L 7/00* (2006.01)
*H03B 5/12* (2006.01)
(52) U.S. Cl. .................... 320/166; 331/18; 331/108 R
(58) Field of Classification Search .................. 320/166
See application file for complete search history.

(56) References Cited

U.S. PATENT DOCUMENTS

| | | | |
|---|---|---|---|
| 7,012,473 B1* | 3/2006 | Kokolakis | 331/17 |
| 7,895,894 B2* | 3/2011 | Kanai et al. | 73/579 |
| 2005/0230730 A1* | 10/2005 | Tanzawa | 257/296 |
| 2010/0019736 A1* | 1/2010 | Katsumi | 320/166 |

* cited by examiner

*Primary Examiner* — M'Baye Diao
(74) *Attorney, Agent, or Firm* — Jianq Chyun IP Office

(57) ABSTRACT

An oscillator circuit including a charge/discharge unit, a capacitance amplifier, and a level detection circuit is provided. The charge/discharge unit is used to receive a control signal, and perform a charge or discharge operation on a charge/discharge terminal according to the control signal. The capacitance amplifier, including a first impedance, a second impedance, a voltage follower, and a capacitor, is capable of providing an equivalent capacitance with amplifying characteristics. An input terminal of the level detection circuit is electrically connected to the charge/discharge terminal of the charge/discharge unit, and the level detection circuit generates the control signal to the charge/discharge unit according to the charge/discharge terminal of the charge/discharge unit. The oscillator circuit of the present invention may use a capacitance with a smaller level to provide an equivalent capacitance with amplifying characteristics, and thus achieve an oscillator function.

10 Claims, 5 Drawing Sheets

OSCILLATOR CIRCUIT

CROSS-REFERENCE TO RELATED APPLICATION

This application claims the priority benefit of Taiwan application serial no. 97150121, filed on Dec. 22, 2008. The entirety of the above-mentioned patent application is hereby incorporated by reference herein and made a part of specification.

BACKGROUND OF THE INVENTION

1. Field of the Invention

The present invention generally relates to an oscillator circuit, in particular, to an oscillator circuit capable of amplifying an equivalent capacitance of a capacitor.

2. Description of Related Art

Due to the rapid development of the technology, the design of electronic devices tends to be lighter. However, for oscillator circuits in the form of a chip, a capacitor above the nano-level cannot yet be manufactured inside a chip, such that during the design of an oscillator circuit at the nano-level, in addition to the circuit of the chip, the user needs to employ an externally connected capacitor so as to normally achieve the oscillator function. The main reason is that the capacitance of the capacitor is excessively large, for example, above 1 nf. Further, the externally connected capacitor may also limit the design and application scope of the oscillator circuit.

Manufacturers of the integrated circuit (IC) are all actively looking for solutions to eliminate the above defects, so as to achieve a complete oscillator function in the IC of the same chip without using an externally connected capacitor.

SUMMARY OF THE INVENTION

Accordingly, the present invention is directed to an oscillator circuit, capable of generating an oscillation frequency, and particularly amplifying an equivalent capacitance of a capacitor by using an amplifier and two impedances.

In order to achieve the above objective, an oscillator circuit including a charge/discharge unit, a first impedance, a second impedance, a voltage follower, a capacitor, and a level detection circuit is provided. The charge/discharge unit is used to receive a control signal, and performs a charge or discharge operation on a charge/discharge terminal according to the control signal. A first terminal of the first impedance is electrically connected to the charge/discharge terminal of the charge/discharge unit. A first terminal of the second impedance is electrically connected to the charge/discharge terminal of the charge/discharge unit. An input terminal of the voltage follower is coupled to a second terminal of the first impedance, and an output terminal of the voltage follower is coupled to a second terminal of the second impedance. A first terminal of the capacitor is coupled to the input terminal of the voltage follower, and a second terminal of the capacitor is coupled to a reference potential. An input terminal of the level detection circuit is electrically connected to the charge/discharge terminal of the charge/discharge unit, and the level detection circuit generates the control signal to the charge/discharge unit according to the charge/discharge terminal of the charge/discharge unit.

In the present invention, a capacitance amplifier of the oscillator circuit may provide an equivalent capacitance with amplifying characteristics. Besides, the IC of the same chip may generate and provide an oscillator function, and the capacitor in the chip may provide an equivalent capacitance with amplifying characteristics according to the design requirement of the IC, such that an externally connected capacitor with a large capacitance is not needed.

In order to make the aforementioned and other objectives, features, and advantages of the present invention comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
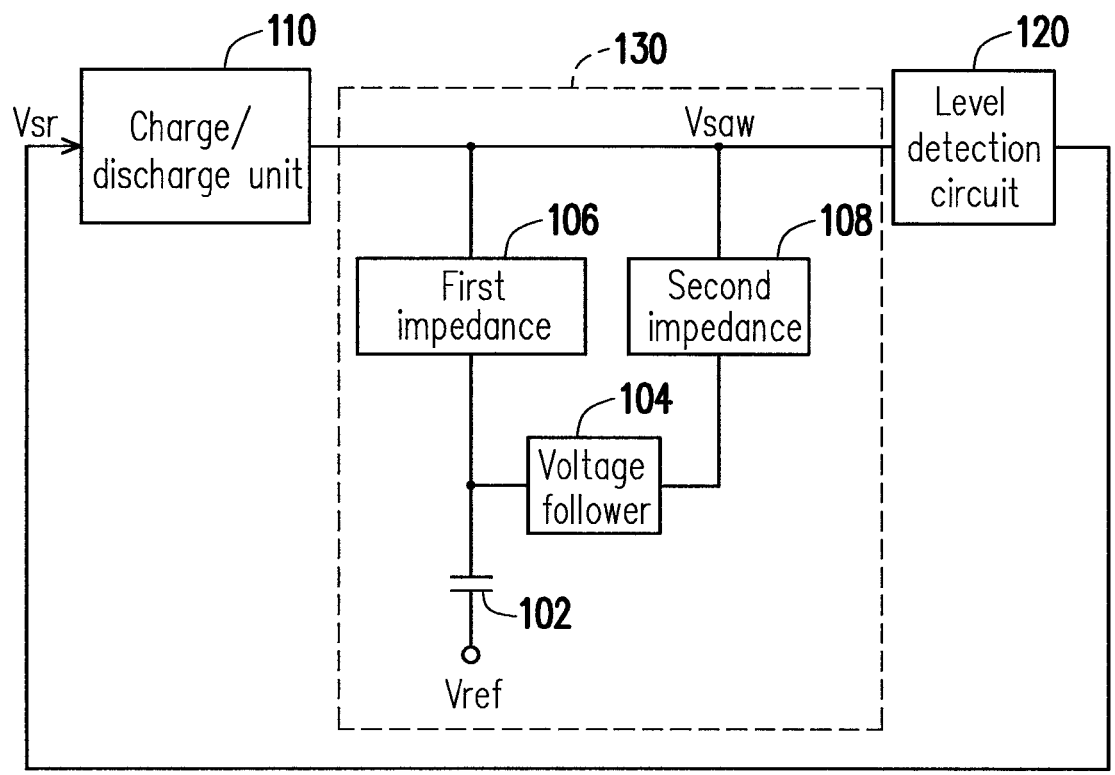
FIG. 1 is an architectural view of an oscillator circuit according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is an architectural view of an oscillator circuit 100 according to an embodiment of the present invention. Referring to FIG. 1, the oscillator circuit 100 includes a charge/discharge unit 110, a capacitor 102, a voltage follower 104, a first impedance 106, a second impedance 108, and a level detection circuit 120. The charge/discharge unit 110 is used to receive a control signal Vsr, and perform a charge or discharge operation on a charge/discharge terminal according to the control signal Vsr. A first terminal of the first impedance 106, a first terminal of the second impedance 108, and an input terminal of the level detection circuit 120 are electrically connected to the charge/discharge terminal of the charge/discharge unit 110. An input terminal of the voltage follower 104 is coupled to a second terminal of the first impedance 106 and a first terminal of the capacitor 102, and an output terminal of the voltage follower 104 is coupled to a second terminal of the second impedance 108. A second terminal of the capacitor 102 is coupled to a reference potential Vref. The level detection circuit 120 may generate the corresponding control signal Vsr according to a change of a potential signal Vsaw at the charge/discharge terminal of the charge/discharge unit 110.

A reference numeral 130 in FIG. 1 is a capacitance amplifier, and the operation principle of the capacitance amplifier 130 is to lock an input potential by the voltage follower 104 so as to make the input potential consistent with an output potential, such that the voltage differences of the first impedance 106 and the second impedance 108 are the same. It is assumed that impedance values of the first impedance 106 and the second impedance 108 are respectively Z1 and Z2, a total current flowing through the capacitance amplifier 130 is I, and current values flowing through the first impedance 106 and the second impedance 108 are respectively I1 and I2, so Z1*I1=Z2*I2, that is, I1:I2=Z2:Z1, and thus the amount of current practically flowing into the capacitor 102 becomes I*Z2/(Z1+Z2). It should be noted that, when a block circuit diagram of the reference numeral 130 does not have the first impedance 106, the second impedance 108, or the voltage follower 104, the amount of current flowing into the capacitor 102 is I. As the block circuit diagram of the reference numeral 130 of this embodiment adopts the first impedance 106, the second impedance 108, and the voltage follower 104, the amount of current flowing into the capacitor 102 is attenuated to $I*Z2/(Z1+Z2)$, and the effect of the equivalent capacitance is equivalent to $(Z1+Z2)/Z2$ times of the original capacitance of the capacitor 102.

It should be noted that, the capacitor with a pico ($10^{-12}$) level capacitance can be manufactured on the IC, but the capacitor above the nano (or millimicro, $10^{-9}$) level cannot yet be manufactured on the IC, so for the oscillator circuit in the form of a chip, the oscillator circuit with the nano-level or the KHz level is designed by using the capacitor with the pico level capacitance and the equivalent capacitance of the capacitance amplifier. Compared with the conventional art, the oscillator circuit according to the embodiment of the present invention may achieve the oscillator function in the IC of the same chip without requiring an externally connected capacitor. Those skilled in the art should understand that the implementation of the present invention is not limited herein, and modifications and variations can be made according to design requirements.

Figure 2:
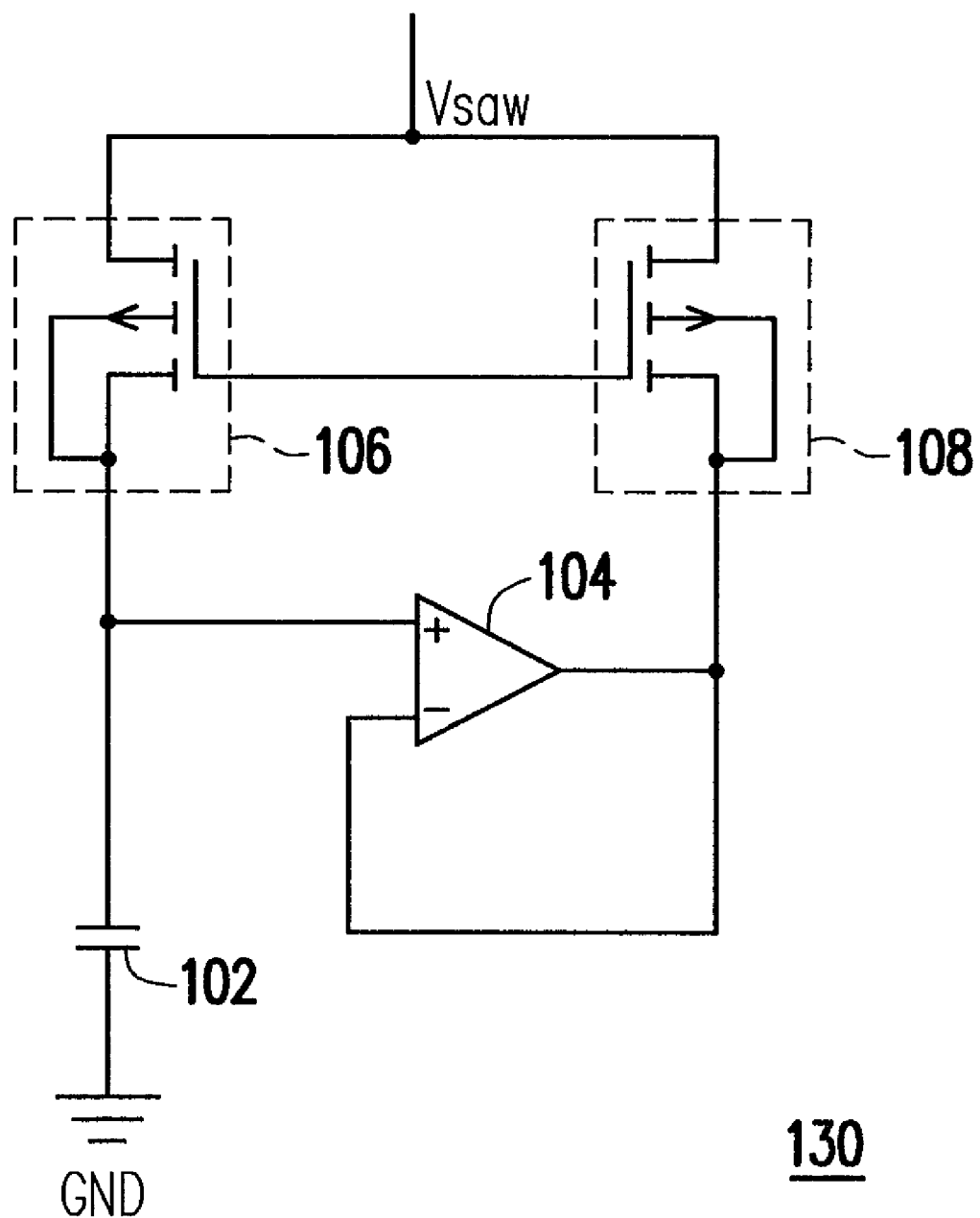
FIG. 2 shows another embodiment of a capacitance amplifier 130.

FIG. 2 shows another embodiment of the capacitance amplifier 130. In FIG. 2, the first impedance 106 and the second impedance 108 are replaced by N type transistor switches, and the voltage follower 104 may be formed by an operational amplifier in a negative feedback manner, in which a "+" input terminal of the voltage follower 104 is coupled to the second terminal of the first impedance 106, and a "−" input terminal and the output terminal of the voltage follower 104 are coupled to the second terminal of the second impedance 108. A terminal of the capacitor 102 is coupled to a "+" input terminal of the amplifier, and the other terminal of the capacitor 102 is coupled to a grounding voltage GND. It is assumed that the impedance values of the first impedance 106 and the second impedance 108 are respectively Z1 and Z2, such that the equivalent capacitance of the capacitor 102 in FIG. 2 is amplified by $(Z1+Z2)/Z2$ times as shown in FIG. 1. Similarly, in some embodiments, the first impedance 106 and the second impedance 108 may be formed or replaced by P type transistor switches or resistors, so as to achieve the same effect.

Figure 3:
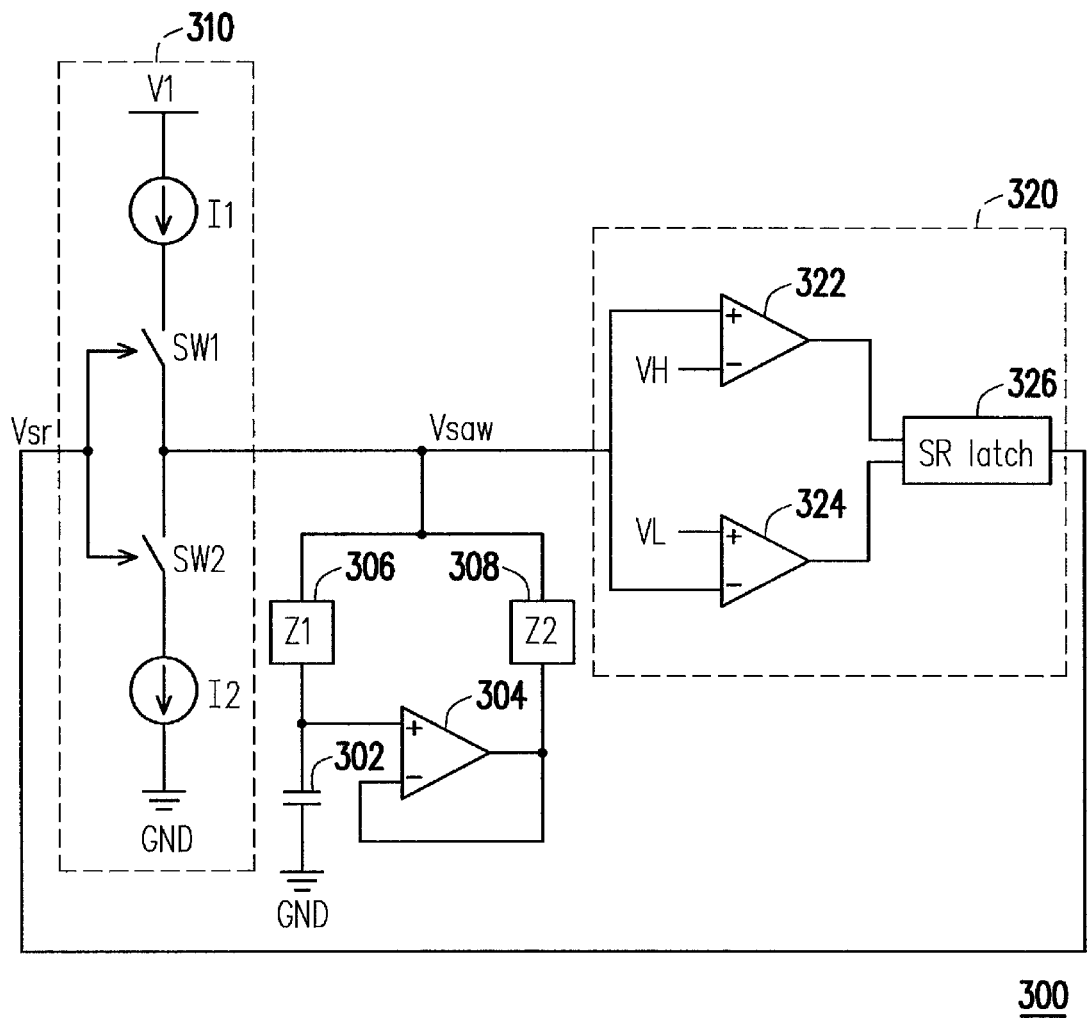
FIG. 3 is an architectural view of an oscillator circuit according to another embodiment of the present invention.

FIG. 3 is an architectural view of an oscillator circuit according to another embodiment of the present invention. Referring to FIG. 3, the oscillator circuit 300 includes a charge/discharge unit 310, a first impedance 306, a second impedance 308, a voltage follower 304, a capacitor 302, and a level detection circuit 320. The charge/discharge unit 310 of this embodiment includes a charging current source I1, a first switch SW1, a second switch SW2, and a discharging current source I2. A first terminal of the charging current source I1 is connected to a voltage V1. A first terminal of the first switch SW1 is connected to a second terminal of the charging current source I1, and a second terminal of the first switch SW1 serves as a charge/discharge terminal of the charge/discharge unit 310. A first terminal of the second switch SW2 is connected to the second terminal of the first switch SW1. A first terminal of the discharging current source I2 is connected to a second terminal of the second switch SW2, and a second terminal of the discharging current source I2 is connected to a grounding voltage GND. A charge/discharge terminal of the first switch SW1 provides the electrical connection of the first impedance 306, the second impedance 308, and the level detection circuit 320, and the first switch SW1 and the second switch SW2 enable the charge/discharge unit 310 to perform a charge or discharge operation according to the control signal Vsr. The switches are operated in the following modes: when the first switch SW1 is turned on, the second switch SW2 is turned off, or when the first switch SW1 is turned off, the second switch SW2 is turned on.

Further referring to FIG. 3, the level detection circuit 320 includes a comparator 322, a comparator 324, and an SR latch 326. A "+" input terminal of the comparator 322 is connected to the charge/discharge terminal of the charge/discharge unit 310 to receive a change of a potential signal Vsaw, and a "−" input terminal of the comparator 322 receives a level set value VH. A "−" input terminal of the comparator 324 is connected to the charge/discharge terminal of the charge/discharge unit 310 to receive the potential signal Vsaw, a "+" input terminal of the comparator 324 receives a level set value VL. A first input terminal and a second input terminal of the SR latch 326 are electrically connected to output terminals of the comparator 322 and the comparator 324, and an output terminal of the SR latch 326 generates the control signal Vsr to the charge/discharge unit 310.

For an operation principle of the level detection circuit 320, by using an output change of the comparator 322 when a voltage value of the potential signal Vsaw exceeds the level set value VH, or an output change of the comparator 324 when a voltage value of the potential signal Vsaw is lower than the level set value VL, when the SR latch 326 receives the output change of the comparator 322 (or the comparator 324), the output of the SR latch 326 is changed accordingly, such that the switch SW1 is turned on and the switch SW2 is turned off (or the switch SW1 is turned off and the switch SW2 is turned on) through the generated control signal Vsr. Next, the capacitor 302 is charged (or discharged). When a potential value of the potential signal Vsaw rises (or falls) till the potential value of the potential signal Vsaw is higher than the level set value VH (or lower than the level set value VL), the outputs of the comparators 322 and 324 are changed. Afterward, the SR latch 326 turns off the switch SW1 and turns on the switch SW2 again. Then, the voltage of the potential signal Vsaw falls and rises in a cycle to form an oscillator. Those skilled in the art should understand that the implementation of the SR latch 326 is not limited herein, and any logic circuit functioning as the SR latch is within the protection scope of the present invention.

Figure 4A:
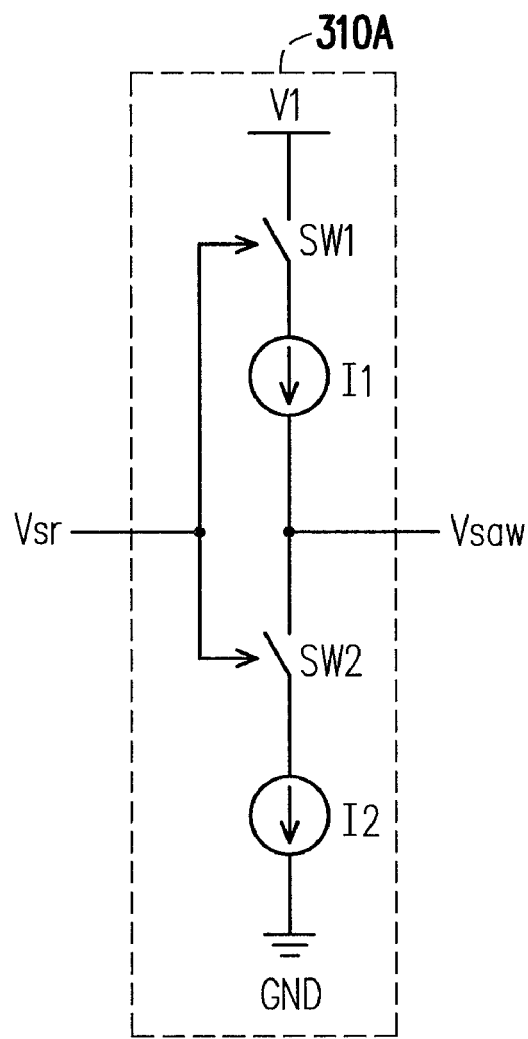
FIGS. 4A to 4C show different implementations of a charge/discharge unit.
Figure 4B:
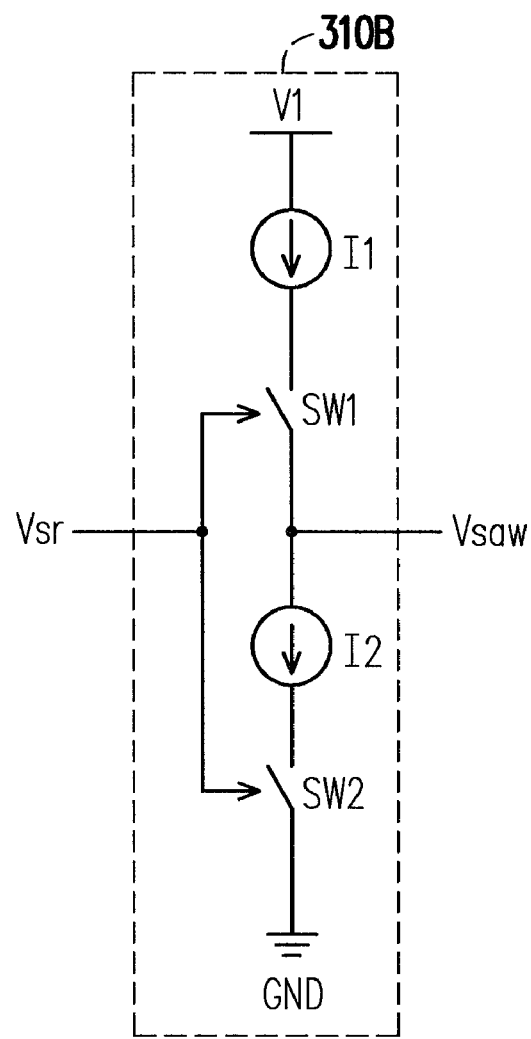
Figure 4C:
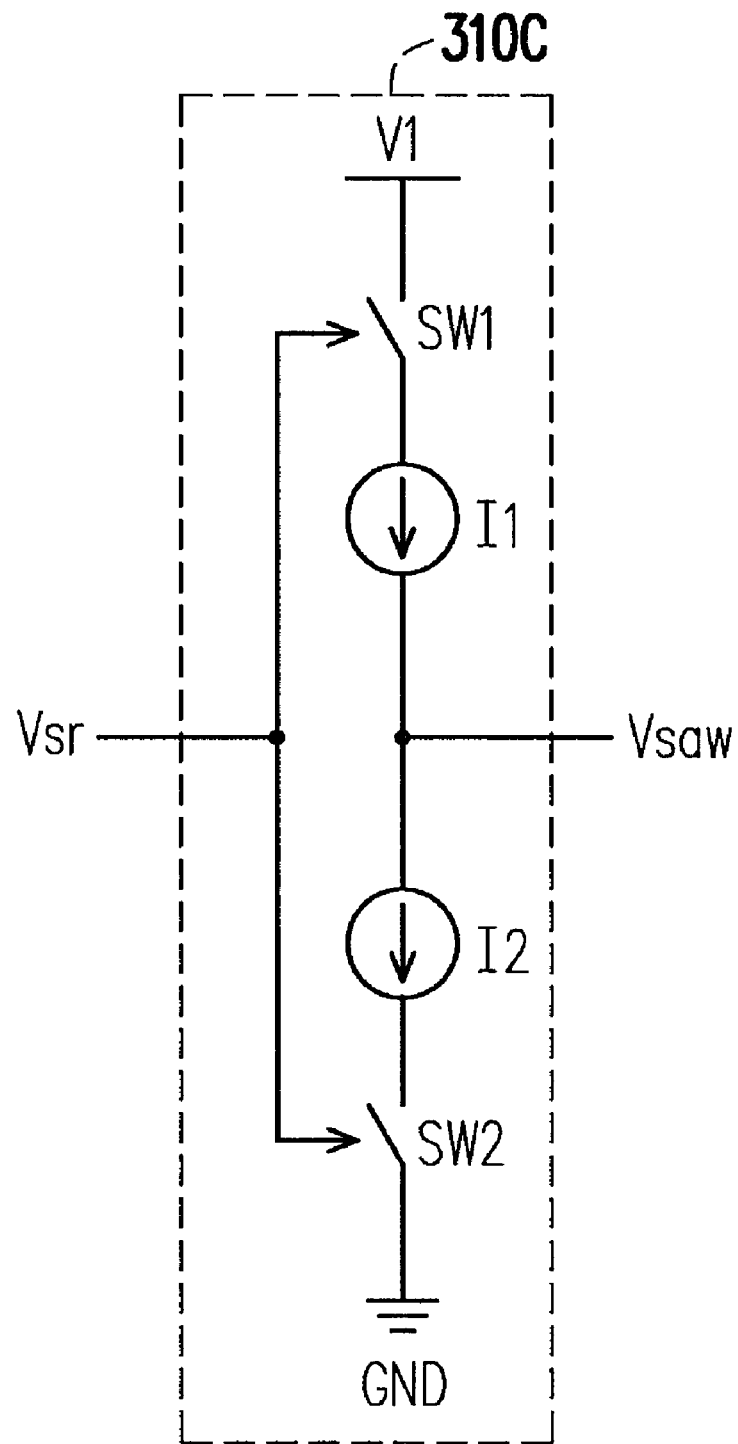

The implementation of the charge/discharge unit 310 is not limited to the above. FIGS. 4A to 4C show different implementations of charge/discharge units 310A to 310C respectively. The components, related controls, and operation principles of the charge/discharge units 310A to 310C may refer to those of the charge/discharge unit 310 in FIG. 3, so the coupling and operation of each component will not be described herein again.

To sum up, the oscillator circuit provided by the embodiment of the present invention at least achieves the following efficacies.

1. The capacitance amplifier of the oscillator circuit may provide an equivalent capacitance with amplifying characteristics.

2. The oscillation frequency may be generated and provided on the IC of the same chip without requiring an externally connected capacitor.

3. The capacitance with a smaller level may be used according to design requirements to provide an equivalent capacitance with amplifying characteristics, so as to achieve the oscillator function.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An oscillator circuit, comprising:
   a charge/discharge unit, for receiving a control signal, and performing a charge or discharge operation on a charge/discharge terminal according to the control signal;
   a first impedance, wherein a first terminal of the first impedance is electrically connected to the charge/discharge terminal of the charge/discharge unit;
   a second impedance, wherein a first terminal of the second impedance is electrically connected to the charge/discharge terminal of the charge/discharge unit;
   a voltage follower, wherein an input terminal of the voltage follower is coupled to a second terminal of the first impedance, and an output terminal of the voltage follower is coupled to a second terminal of the second impedance;
   a capacitor, wherein a first terminal of the capacitor is coupled to the input terminal of the voltage follower, and a second terminal of the capacitor is coupled to a reference potential; and
   a level detection circuit, wherein an input terminal of the level detection circuit is electrically connected to the charge/discharge terminal of the charge/discharge unit, and the level detection circuit generates the control signal to the charge/discharge unit according to the charge/discharge terminal of the charge/discharge unit.

2. The oscillator circuit according to claim 1, wherein the charge/discharge unit comprises:
   a charging current source, wherein a first terminal of the charging current source is connected to a first voltage;
   a first switch, wherein a first terminal of the first switch is connected to a second terminal of the charging current source, and a second terminal of the first switch serves as the charge/discharge terminal of the charge/discharge unit;
   a second switch, wherein a first terminal of the second switch is connected to the second terminal of the first switch; and
   a discharging current source, wherein a first terminal of the discharging current source is connected to a second terminal of the second switch, and a second terminal of the discharging current source is connected to a second voltage,
   wherein the first switch and the second switch enable the charge/discharge unit to perform the charge or discharge operation according to the control signal, when the first switch is turned on, the second switch is turned off, and when the first switch is turned off, the second switch is turned on.

3. The oscillator circuit according to claim 1, wherein the charge/discharge unit comprises:
   a first switch, wherein a first terminal of the first switch is connected to a first voltage;
   a charging current source, wherein a first terminal of the charging current source is connected to a second terminal of the first switch, and a second terminal of the charging current source serves as the charge/discharge terminal of the charge/discharge unit;
   a second switch, wherein a first terminal of the second switch is connected to the second terminal of the charging current source; and
   a discharging current source, wherein a first terminal of the discharging current source is connected to a second terminal of the second switch, and a second terminal of the discharging current source is connected to a second voltage,
   wherein the first switch and the second switch enable the charge/discharge unit to perform the charge or discharge operation according to the control signal, when the first switch is turned on, the second switch is turned off, and when the first switch is turned off, the second switch is turned on.

4. The oscillator circuit according to claim 1, wherein the charge/discharge unit comprises:
   a charging current source, wherein a first terminal of the charging current source is connected to a first voltage;
   a first switch, wherein a first terminal of the first switch is connected to a second terminal of the charging current source, and a second terminal of the first switch serves as the charge/discharge terminal of the charge/discharge unit;
   a discharging current source, wherein a first terminal of the discharging current source is connected to the second terminal of the first switch; and
   a second switch, wherein a first terminal of the second switch is connected to a second terminal of the discharging current source, and a second terminal of the second switch is connected to a second voltage,
   wherein the first switch and the second switch enable the charge/discharge unit to perform the charge or discharge operation according to the control signal, when the first switch is turned on, the second switch is turned off, and when the first switch is turned off, the second switch is turned on.

5. The oscillator circuit according to claim 1, wherein the charge/discharge unit comprises:
   a first switch, wherein a first terminal of the first switch is connected to a first voltage;
   a charging current source, wherein a first terminal of the charging current source is connected to a second terminal of the first switch, and a second terminal of the charging current source serves as the charge/discharge terminal of the charge/discharge unit;
   a discharging current source, wherein a first terminal of the discharging current source is connected to the second terminal of the charging current source; and
   a second switch, wherein a first terminal of the second switch is connected to a second terminal of the discharging current source, and a second terminal of the second switch is connected to a second voltage,
   wherein the first switch and the second switch enable the charge/discharge unit to perform the charge or discharge operation according to the control signal, when the first switch is turned on, the second switch is turned off, and when the first switch is turned off, the second switch is turned on.

6. The oscillator circuit according to claim 1, wherein the level detection circuit comprises:
   a first comparator, wherein a first input terminal of the first comparator is electrically connected to the charge/discharge terminal of the charge/discharge unit, and a second input terminal of the first comparator receives a first level set value;
   a second comparator, wherein a first input terminal of the second comparator is electrically connected to the charge/discharge terminal of the charge/discharge unit, and a second input terminal of the second comparator receives a second level set value; and an SR latch, wherein a first input terminal and a second input terminal of the SR latch are electrically connected to output terminals of the first comparator and the second comparator, and an output terminal of the SR latch generates the control signal to the charge/discharge unit.

7. The oscillator circuit according to claim 1, wherein the first impedance is a first transistor, and the second impedance is a second transistor.

8. The oscillator circuit according to claim 7, wherein a first terminal and a second terminal of the first transistor respectively serve as the first terminal and the second terminal of the first impedance, a first terminal and a second terminal of the second transistor respectively serve as the first terminal and the second terminal of the second impedance, and a control terminal of the first transistor is electrically connected to a control terminal of the second transistor.

9. The oscillator circuit according to claim 1, wherein the voltage follower comprises an amplifier, a first input terminal of the amplifier is coupled to the second terminal of the first impedance, and a second input terminal and an output terminal of the amplifier are coupled to the second terminal of the second impedance.

10. The oscillator circuit according to claim 1, wherein the reference potential is a grounding voltage.

* * * * *